(12) United States Patent
Noujeim et al.

(10) Patent No.: US 8,417,189 B2
(45) Date of Patent: Apr. 9, 2013

(54) FREQUENCY-SCALABLE SHOCKLINE-BASED VNA

(75) Inventors: Karam Michael Noujeim, Los Altos, CA (US); Jon S. Martens, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 387 days.

(21) Appl. No.: 12/813,337

(22) Filed: Jun. 10, 2010

(65) Prior Publication Data

US 2011/0306314 A1 Dec. 15, 2011

(51) Int. Cl.
*H04B 17/00* (2006.01)
*G01R 19/00* (2006.01)

(52) U.S. Cl. ............... 455/67.11; 455/67.14; 455/226.1; 324/76.11; 324/650

(58) Field of Classification Search ............... 455/67.11, 455/67.14, 67.15, 67.16, 226.1, 227, 255, 455/266; 324/650, 630, 76.11, 661
See application file for complete search history.

(56) References Cited

U.S. PATENT DOCUMENTS

| | | | | |
|---|---|---|---|---|
| 4,956,568 A | * | 9/1990 | Su et al. | 327/321 |
| 5,014,018 A | * | 5/1991 | Rodwell et al. | 333/20 |
| 5,121,067 A | * | 6/1992 | Marsland | 324/637 |
| 5,256,996 A | * | 10/1993 | Marsland et al. | 333/20 |
| 5,264,800 A | * | 11/1993 | Black | 327/2 |
| 5,267,020 A | * | 11/1993 | Marsland et al. | 257/368 |
| 5,378,939 A | * | 1/1995 | Marsland et al. | 327/91 |
| 5,804,921 A | | 9/1998 | McEwan | |
| 6,456,092 B1 | * | 9/2002 | Arnold et al. | 324/639 |
| 6,894,581 B2 | | 5/2005 | Noujeim | |
| 6,943,563 B2 | * | 9/2005 | Martens | 324/638 |
| 7,088,111 B2 | * | 8/2006 | Noujeim | 324/650 |
| 7,170,365 B2 | | 1/2007 | Agoston | |
| 7,239,150 B2 | * | 7/2007 | Troxler et al. | 324/643 |
| 7,518,353 B2 | * | 4/2009 | Tanbakuchi et al. | 324/76.77 |
| 2008/0094072 A1 | * | 4/2008 | Noujeim | 324/630 |

* cited by examiner

*Primary Examiner* — Duc M Nguyen

(57) ABSTRACT

A high-frequency VNA system is provided using non-linear transmission line (NLTL or shockline) based samplers configured to provide scalable operation characteristics. Scaling to adjust noise performance vs. frequency is accomplished as follows: (1) increasing or decreasing the fall time of a shockline's output voltage waveform. This is accomplished by changing the number of Schottky varactors in a shockline, as well as changing the shockline's Bragg cutoff frequency by setting the spacing between Schottky varactors; (2) changing the structure of the pulse-forming network connected with the sampler by changing the length of the differentiator arms in the sampler pulse-forming network; and (3) changing the LO signal frequency applied to the shockline. Multiple NLTL based samplers are multiplexed to form a broadband reflectometer with the multiplexing circuitry selectively connecting one of the NLTL based sampler segments at a time to allow user selection of a desired performance vs. frequency response for each segment.

14 Claims, 14 Drawing Sheets

FREQUENCY-SCALABLE SHOCKLINE-BASED VNA

BACKGROUND

1. Technical Field

The present invention relates to components that extend the frequency range of a Vector Network Analyzer (VNA). More particularly, the present invention relates to high-frequency components such as non-linear transmission lines or shocklines that enable sampler-based VNAs to operate at high frequencies.

2. Related Art

A. High-Frequency Sampler-Based VNA Receivers in General

Sampler-based VNA receivers make use of equivalent-time sampling to down-convert RF stimulus and response signals to lower intermediate-frequency (IF) signals. In effect, the samplers "time-stretch" coupled versions of RF signal waves incident on and reflected from a device under test (DUT). This sampling approach results in a simplified VNA architecture with reduced cost in comparison with one employing fundamental mixing where the RF-to-IF conversion is made using the fundamental local oscillator (LO) signal as opposed to a harmonic of the LO.

FIG. 1 shows a block diagram illustrating typical components of a sampler-based VNA. The RF signal generator 100 provides an RF signal through switch 102 to two possible paths 104 and 105 along which incident signals a1 and a2 are provided to a DUT 106. The RF signal is also coupled through couplers 108a and 110a as an RF reference signal to respective reference samplers 112a and 114a for down-conversion to IF reference signals $IF_{a1}$ and $IF_{a2}$. Signals b1 and b2 that are reflected from or transmitted through the DUT 106 are coupled through couplers 108b and 110b to respective test samplers 112b and 114b in the form of test signals for down-conversion to IF signals $IF_{b1}$ and $IF_{b2}$. Analog-to-digital converters (not shown) convert the $IF_{a1}$, $IF_{a2}$, $IF_{b1}$ and $IF_{b2}$ to digital signals for processing and analysis that are geared at extracting the DUT response.

In each of the samplers 112a, 112b, 114a and 114b, the RF signal is mixed with a harmonic of the LO signal generator 120 to form the IF signals $IF_{a1}$, $IF_{b1}$, $IF_{a2}$ and $IF_{b2}$. The harmonic generator 122 connects LO signal generator 120 to the samplers 112a, 112b, 114a and 114b and provides harmonics of the fundamental LO signal generator 120, thereby increasing significantly the LO frequency provided to the samplers 112a, 112b, 114a and 114b.

As a direct result of the nature of the equivalent-time-sampling process, the LO source 120 required for strobing the samplers 112a, 112b, 114a and 114b operates in a lower frequency range than would be required in a fundamental-mixer VNA where the LO is directly connected to the mixers. Equivalent-time sampling, however, is provided at the expense of increased conversion loss.

B. Sampler Circuitry

FIG. 2 shows one implementation of a sampling circuit that has been used extensively in microwave VNAs, sampling oscilloscopes, frequency counters, etc. The sampling circuit of FIG. 2 can be used to form samplers 112a, 112b, 114a and 114b of FIG. 1. The circuit of FIG. 2 was introduced by W. M Grove in "Sampling for Oscilloscopes and Other RF Systems: DC Through X-Band," IEEE MTT, Vol. 66, No. 1, May 1966. In this sampler circuit, a voltage pulse $V_{LO}$ is generated by signal source 200 (which can be formed by the output of harmonic generator 122 of FIG. 1). The $V_{LO}$ source 200 is provided through source resistance 201 ($R_{S-LO}$). The signal $V_{LO}$ gates the Schottky diodes 202 and 203 over a brief time interval $T_g$, known also as the gating time. Over this interval, the Schottky diodes 202 and 203 are driven into conduction and result in charging of the sampling capacitors 204 and 206 having a capacitance labeled $C_s$. The charge present on the capacitors 204 and 206 results in an output waveform provided at $V_{IF}$ through resistors 220 and 222 with value $R_F$ that is related to the polarity and amplitude of the RF input from $V_{RF}$ source 208. The signal from RF source 208 is provided through a resistor divider with resistors 210 and 211 each having a resistance $R_s$. The voltage pulse provided across the sampling bridge (i.e. series connection of 204, 203, 202, 206) is formed by differentiating the step-like voltage waveform generated from the $V_{LO}$ source 200 by means of a pair of commensurate-length shorted stubs (210,212) and (214,218) located on either side of the sampling bridge. To elaborate, transmission lines (212, 210) and (214, 218) are shorted and used to transform a step voltage from $V_{LO}$ source 200 into a pulse that gates the sampling Schottky diodes 202 and 203. The voltage at $V_{IF}$ is further shaped by a filter formed by capacitor 224 ($C_H$) and resistor 226 ($R_L$) connecting the output $V_{IF}$ to ground.

FIG. 3 shows an equivalent circuit for the components of FIG. 2. The equivalent circuit for a Schottky diode is a series combination of a Schottky diode junction resistance Rj 302, its ohmic resistance Rd 304, and an ideal switch gated at the rate of the $V_{LO}$ source. The equivalent circuit of FIG. 3 thus includes the switched gate 300 driven by the $V_{LO}$ source, along with the junction resistance Rj/2 302 and ohmic resistance Rd/2 304 that are equivalent to the combined diodes 202 and 203. The RF source 208 has an equivalent voltage $V_{RF}/2$ at 308 connected to an equivalent resistance Rs/2 310 for resistors 210 and 211. The capacitors 204 and 206 have an equivalent capacitance 2Cs 306, while filter resistors 220 and 221 have an equivalent resistance $R_F/2$ 320. The output filter keeps the same values Cs 324 and $R_L$ 326 as elements 224 and 226 of FIG. 2.

The 3-dB RF bandwidth of the sampler shown having the equivalent circuit shown in FIG. 3 will be inversely proportional to the gating time $T_g$ (that is, $f_{3-dBRF} \approx 0.35/T_g$). For a given RF frequency $f_{RF}$, the LO frequency is then chosen to reduce the harmonic number N and, thus, the conversion loss and noise figure of the sampler.

C. Samplers Using Step Recovery Diodes

Practical implementations of samplers for VNAs have relied traditionally on step-recovery diodes (SRD) connected as $V_{LO}$ source 200 to generate pulses applied to the switches. Commercial SRDs are traditionally limited to LO inputs having frequencies that do not exceed a few hundred MHz. This is due to the fact that the transit time of an SRD limits the frequency of its input. This limitation is a fundamental one in the context of microwave and millimeter-wave VNAs since it requires that a high harmonic number N be used in the down-conversion process, resulting in an increase in the noise figure of the sampler due to image-response conversion. In addition, the use of a high harmonic number increases the number of spurious receiver responses and can reduce the effective dynamic range of a VNA.

Another fundamental limitation in an SRD-based VNA is the RF leakage between channels. Because SRDs are fundamentally governed by avalanche phenomena, a single SRD is typically used for all channels of the VNA's receiver. If a separate SRD were used in each channel, the gating pulses would not be synchronous and the phase relationship between the receiver channels would not be stable. As a result, the distribution scheme shown in FIG. 4 is commonly used with a single SRD in order to keep receiver channels synchronous.

FIG. 4 illustrates a VNA configuration with a single SRD circuit 405 to drive the four separate samplers 412a, 412b, 414a and 414b in a two-channel VNA. The SRD 405 is driven by a $V_{LO}$ source 420 with its resistance $R_{S-LO}$ 421, similar to source 200 and resistance 201 of FIG. 2. The signal from the SRD circuit 405 generates pulses that are distributed from power splitter 407 to the four samplers 412a, 412b, 414a and 414b. Each of the samplers can include circuitry similar to that shown in FIG. 2 that is supplied by the $V_{LO}$ source 200 and resistor 201. The reference sampler 412a and test sampler 412b downconvert signals for a first channel A, similar to samplers 212a and 212b of the VNA circuitry of FIG. 2. The reference sampler 414a and test sampler 414b downconvert signals for a second channel B, similar to samplers 214a and 214b of FIG. 2. In channel A, an RF signal is provided from $V_{RF-A}$ source 400a through couplers 408a and 408b to a first port of a highly reflective DUT 406. In channel B, an RF signal from $V_{RF-B}$ source 400a at the second port of DUT 406 is provided through couplers 410a and 410b to a load 400b. The couplers 408a and 408b of channel A provide a similar function to couplers 108a and 108b of FIG. 1. Similarly, couplers 410a and 410b of channel B provide a similar function to couplers 110a and 110b of FIG. 1.

The leakage between channels A and B even with a single SRD 405 can occur in the path between the channels illustrated by dashed lines in FIG. 4. Leakage can occur between samplers 412a, 412b, 414a and 414b, since the SRD output frequency must be high and isolation amplifiers cannot be used. Thus with a purely passive network, there is an isolation limitation (signals leak from one sampler, through the distribution network, into another sampler). Thus, it is desirable to provide other alternatives to create LO signals to drive samplers other than the SRD approach for a high-frequency VNA/measuring transceiver.

D. Samplers Based on Nonlinear Transmission Lines

A nonlinear transmission line (NLTL) provides a distributed alternative to the SRD, thereby providing a $V_{LO}$ signal source 200 for VNA samplers that can operate over a broad range to very high frequencies and experience minimal channel leakage. SRDs made possible the extension of the RF bandwidth in VNAs to 65 GHz. An example of an SRD-based sampling VNA operating to 65 GHz is the Lightning VNA 37397D manufactured by Anritsu Company of Morgan Hill, Calif. But achieving frequencies above 65 GHz using SRDs has been prevented by the limited fall time for the SRD-based samplers. This frequency limitation, however, can be far removed using NLTLs or shocklines.

FIG. 5 shows representative circuit of a sampler-based VNA using NLTLs 561-564 to provide the LO input to samplers 512a, 512b, 514a and 514b. NLTLs are distributed devices that support the propagation of nonlinear electrical waves such as shocks and solitons. As shown by NLTL 561 of FIG. 5, the NLTL is made up of high-impedance transmission line (571,572) loaded periodically with varactor diodes 573 forming a propagation medium whose phase velocity, and thus time delay, is a function of the instantaneous voltage. For a step-like waveform, the trough of the wave travels at a faster phase velocity than the peak, resulting in compression of the fall time, and thus the formation of a steep wave front that approaches that of a shock wave.

Shockline-based samplers, whether used in a VNA or other receivers to achieve very high frequency operation, have been the subject of patents and numerous articles. For example, shockline devices for use in samplers are described in the following: U.S. Pat. No. 5,014,018 entitled "Nonlinear Transmission Line for Generation of Picosecond Electrical Transients," by Rodwell, et al.; U.S. Pat. No. 7,088,111 entitled "Enhanced Isolation Level Between Sampling Channels in A Vector Network Analyzer," by K. Noujeim; and U.S. Pat. No. 6,894,581 entitled "Monolithic Nonlinear Transmission Lines and Sampling Circuits with Reduced Shock-Wave-to-Surface-Wave Coupling," by K. Noujeim.

In contrast with an SRD where output frequencies are limited to tens of GHz, an NLTL can be designed to generate output frequencies spanning hundreds of GHz, making it ideal for gating samplers whose bandwidth exceeds by far that of the aforementioned 65 GHz SRD-based sampler. In fact, it is the NLTL's frequency-scalable input and output that set it apart from SRDs' and allow broadband sampler operation based on lower harmonic numbers, thus resulting in improved noise figure and spurious responses. The input and output frequency ranges of an NLTL are predicted by its input and output Bragg cutoff frequencies, which are a function of the spacing d (shown in NLTL 551) between cells in a shockline as indicated in U.S. Pat. No. 5,014,018 referenced previously. When driven with a sinusoidal signal, such as the $V_{LO}$ signal 520 in FIG. 5, the NLTL circuit compresses the signal's fall time, resulting in a waveform that is rich in high-frequency harmonics. Monolithic implementations of this circuit and derivatives thereof have recently been made on GaAs substrates. See for example, U.S. Pat. No. 4,956,568 entitled "Monolithic Sampler," by Sy et al; and U.S. Pat. Nos. 5,267,020 and 5,378,939 entitled "Gallium Arsenide Monolithically Integrated Sampling Head Using Equivalent Time Sampling Having a Bandwidth Greater Than 100 GHz," by Marsland et al. These shockline implementations dealt with the generation of picosecond pulses for the purpose of gating samplers, making possible the down-conversion of extremely high frequency millimeter-wave and submillimeter-wave signals based on the use of lower harmonic numbers, and resulting in the concomitant improvement in noise figure and spurious responses.

FIG. 5 further illustrates that with NLTLs, as opposed to SRDs, a separate one of the NLTLs 561-564 can be used to supply each sampler 512a, 512b, 514a and 514b. Use of separate NLTLs with each sampler does not impact the gating-pulse synchronicity between samplers. This results from the stability of the distributed fall-time compression mechanism in a shockline (or NLTL), and is in sharp contrast with an SRD in which fall time is based on device-dependent charge storage.

FIG. 5 further illustrates that with NLTLs, as opposed to SRDs, isolators 531-534, amplifiers 541-544 and filters 551-554 can be used to improve channel-to-channel isolation. This is possible since amplifiers covering the input frequency range of a shockline provided by the source $V_{LO}$ 520 are feasible. This is in direct contrast with an SRD whose output frequencies are over a range that exceeds that of available amplifiers and isolators. The availability of isolators 531-534, amplifiers 541-544 and filters 551-554 for use with NLTLs is described in U.S. Pat. No. 7,088,111, referenced previously.

Similar to FIG. 4, the circuitry of channel A in FIG. 5 includes an RF signal provided from $V_{RF-A}$ source 500a through couplers 508a and 508b to a first port of DUT 506. In channel B, an RF signal from the $V_{RF-A}$ source 500a at the second port of DUT 506 is provided through couplers 510a and 510b to a load 500b. The couplers 508a and 508b of channel A provide a similar function to couplers 108a and 108b of FIG. 1, and 408a and 408b of FIG. 4. Similarly, couplers 410a and 410b of channel B provide a similar function to couplers 110a and 110b of FIG. 1, and 408a and 408b of FIG. 4. The leakage between channels A and B, though smaller than leakage experienced with the SRD circuitry of FIG. 4, can occur in the path between channels A and B that is illustrated by dashed lines in FIG. 5.

It would be desirable to provide circuitry to make NLTLs or shocklines even more amenable for use in VNAs.

SUMMARY

Embodiments of the present invention provide a VNA system using NLTLs with frequency-scalable operation characteristics. To achieve scalability and broadband performance, multiple NLTL-based samplers are multiplexed together to form a single broadband reflectometer for a VNA. Each multiplexed NLTL-based sampler can then be configured to have optimal noise performance characteristics. Scaling to adjust noise performance vs. frequency for the reflectometer according to embodiments of the present invention is accomplished by: (1) increasing or decreasing the Bragg cutoff frequency of the shockline, such as by changing the spacing between varactor diodes of the NLTL, so as to either reduce or increase the fall time of its output voltage waveform; (2) changing the structure of the pulse forming network connected with the sampler, such as by changing the length of the voltage-step differentiator arms in the pulse forming network; and (3) changing the LO signal frequency applied to the shockline. These three methods together accomplish scaling while optimizing the tradeoff between conversion loss and bandwidth over a range of desired bandwidths.

To accomplish frequency scaling, a series of sampler-based NLTLs are provided along with multiplexing circuitry to allow selection of a desired NLTL assembly. The spacing between the varactor diodes in each NLTL is set differently in each shockline to allow user selection of the appropriate shockline assembly. Setting the spacing between varactor diodes and adjusting the length of the shorted stubs in the sampler circuitry allows scaling by shrinking or expanding the sampling pulse width. Finally, the $V_{LO}$ signal source can be provided through frequency multipliers to individual NLTL based sampler segments to provide desired LO signal ranges. Alternatively a crystal oscillator or other reference frequency source can be provided to synchronize different LO signal sources that supply each individual NLTL based sampler segment to provide selected LO signal ranges.

To accomplish multiplexing of the NLTL sampler segments so that different scaling can be used for each segment, one of several configurations can be used. In one configuration, each multiplexed NLTL segment includes a single NLTL integrated with a sampler or pulse forming network. The output of the pulse forming network is then used to gate two samplers. In another configuration, two separate NLTLs integrated with two separate pulse forming networks drive two separate test and reference samplers to provide better isolation between the test and reference channels.

Similarly, LO distribution circuitry can be provided in different configurations with the various multiplexing formats. In a first configuration, a single LO signal source supplying a first NLTL sampler segment is connected through couplers and different frequency multipliers to the other NLTL sampler segments. In a second configuration a single LO signal source is used for the first NLTL sampler segment, and a coupler connects through a frequency multiplier to the second segment. The third segment is then connected by a coupler and frequency multiplier to the second segment, and so forth. In a third LO distribution configuration, couplers are not used, and instead a single crystal oscillator reference or other reference frequency source connects to synchronize a separate LO source supplying each NLTL sampler segment.

BRIEF DESCRIPTION OF THE DRAWINGS

Further details of the present invention are explained with the help of the attached drawings in which.

DETAILED DESCRIPTION

To accomplish frequency scaling when using NLTLs in embodiments of the present invention, it is initially realized that by changing gating time, Tg, frequency vs. conversion efficiency can be controlled. A reduction in the gating time Tg of the sampling Schottky diodes can be shown to provide an increase in RF output bandwidth at the expense of reduced conversion efficiency. Adjusting the Bragg frequency of the NLTL as well as the length of the shorted stubs in the sampler changes this gating time, Tg, and thus allows scaling of the sampler's RF bandwidth.

Figure 6:
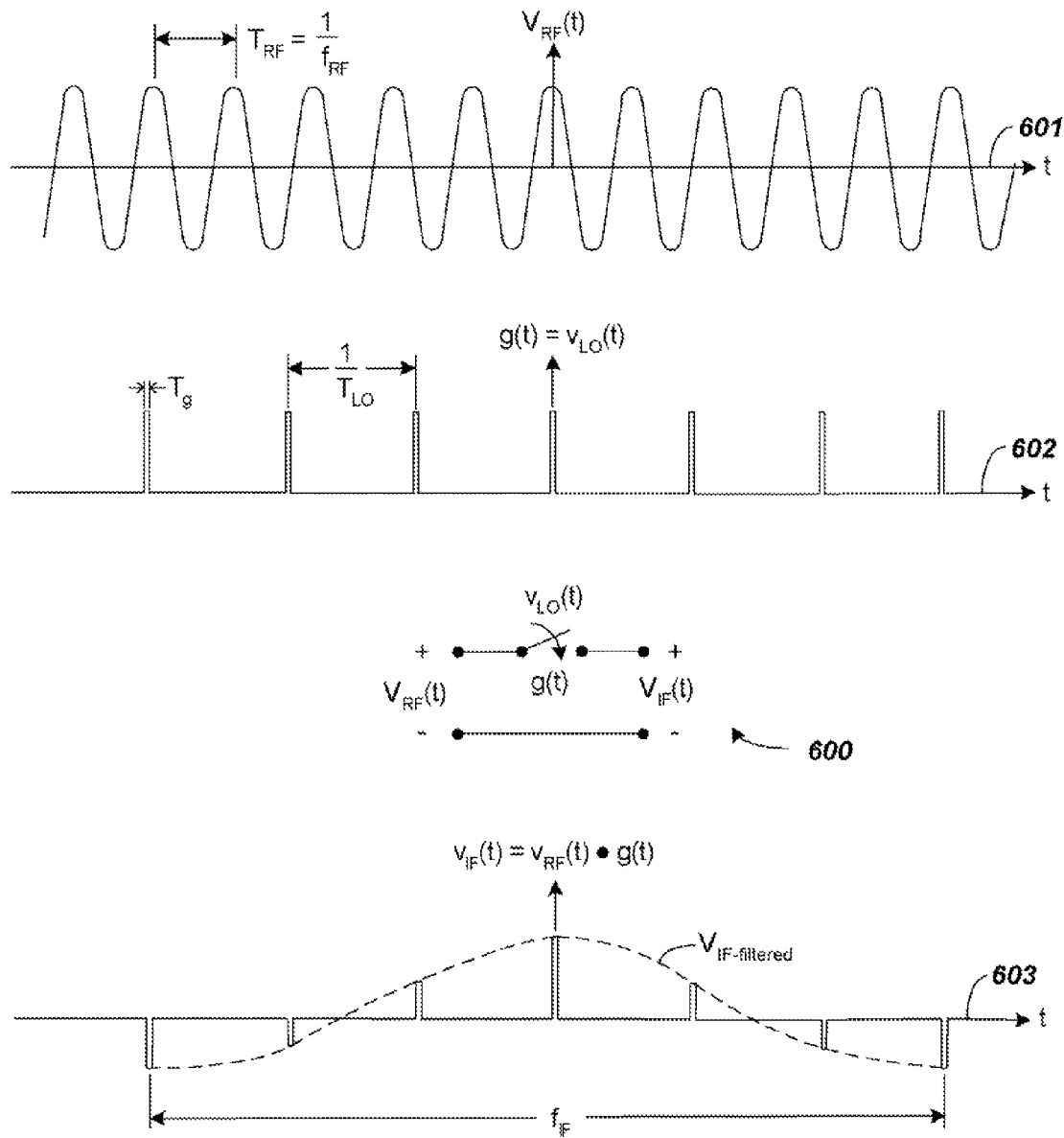
FIG. 6 shows a time-domain illustration of a harmonic sampling process wherein an ideal switch gated at a rate $1/T_{LO}$ by a $V_{LO}$ signal samples an RF signal $V_{RF}$ with a gating time of Tg to produce an output $V_{IF}$.

FIG. 6 shows a time-domain illustration of a harmonic sampling process wherein an ideal switch gated by a $V_{LO}$ signal at a rate $1/T_{LO}$ samples an RF signal $V_{RF}$ with a gating time of Tg to produce an output $V_{IF}$. The plots of FIG. 6 illustrate the effect of adjusting gating time Tg in the switch with the realization that the periodic nature of the RF waves makes possible their down-conversion by equivalent-time sampling, also known as under-sampling, harmonic sampling, or super-Nyquist sampling.

In FIG. 6, plot 601 shows the RF voltage waveform $V_{RF}$ applied to ideal switch circuit 600 over time t. The sinusoidal voltage $V_{RF}(t)=A\cos(2\pi f_{RF}(t))$ shown has a period $T_{RF}$. Plot 602 shows the effect of periodically connecting the switch 600 having a conductance g(t) at a switching rate $T_{LO}=1/f_{LO}$ with a gating aperture Tg. The conductance g(t) is plotted versus time, with conductance controlled by the LO voltage $V_{LO}$ so that $g(t)=V_{LO}(t)$. The final plot 603 shows the $v_{IF}(t)$ output of switch 600 providing a down-converted IF waveform. A dashed line in plot 603 also shows a low-pass filtered version of the $v_{IF}(t)$ output pulses $V_{IF-filtered}$. Evident from plot 603 is the fact that the sampled IF waveform $v_{IF}(t)$ is the arithmetic product of the sinusoidal RF waveform $v_{RF}(t)$ of plot 601 and the ideal switch conductance g(t) of plot 602.

Figure 7:
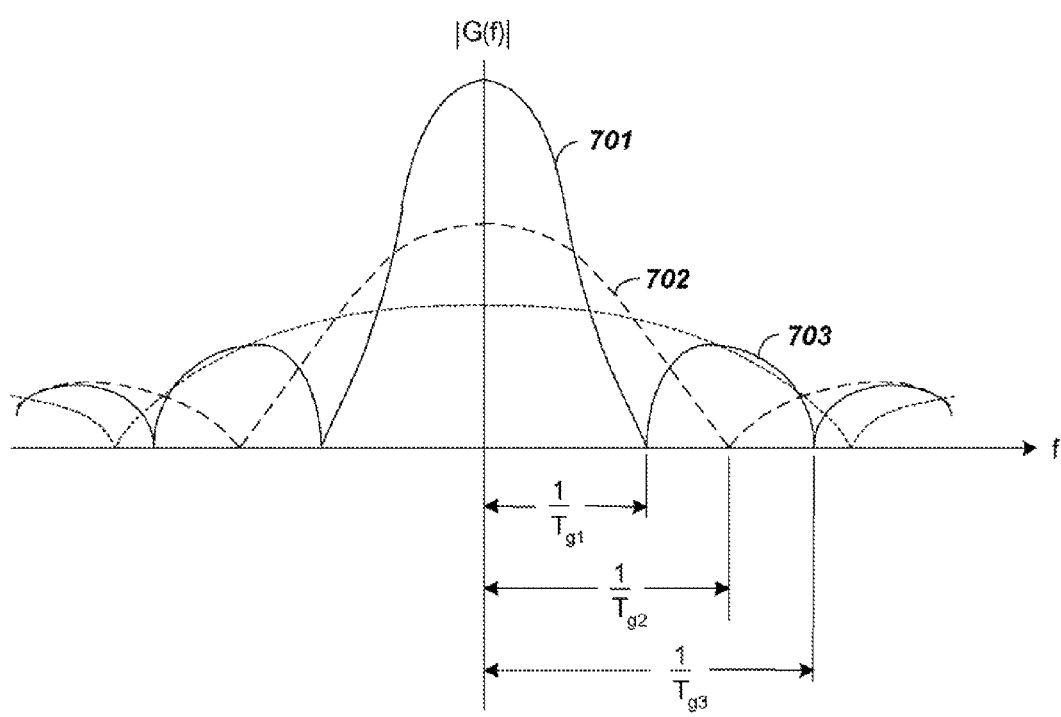
FIG. 7 shows the magnitude response vs. frequency of the ideal switch of FIG. 6 where a change in gating time Tg affects RF bandwidth.

FIG. 7 shows the magnitude response vs. frequency plot of ideal switch 600 of FIG. 6 which illustrates how a change in gating time Tg affects RF bandwidth. A reduction in the gating time Tg from one pulse to another is shown accompanied by an increase in RF bandwidth at the expense of reduced conversion efficiency. A first pulse 701 has the longest gating time $T_{g1}$, and hence the shortest RF frequency response $f_{g1}=1/T_{g1}$. The accompanying magnitude response of the pulse 701 and pulse width is highest, indicating conversion efficiency is highest. However, the longer gating time pulse 701 corresponds to a lower Bragg cutoff frequency for the NLTL. A second dashed pulse 702 shows a slight decrease in gating time $T_{g2}$, with an accompanying increase in RF bandwidth and decrease in conversion efficiency relative to pulse 701. Finally a dotted pulse 703 shows another decrease in gating time $T_{g3}$, and its further increase in RF bandwidth and decrease in conversion efficiency relative to pulse 701. With the switching device 600 made using a shockline-based sampler, an increase in the LO drive frequency and the Bragg cutoff frequency of the NLTL (i.e. shockline) shortens its fall time, thus reducing the gating time Tg of the sampler, resulting in a wider sampler RF bandwidth at the expense of reduced conversion efficiency.

Figure 5:
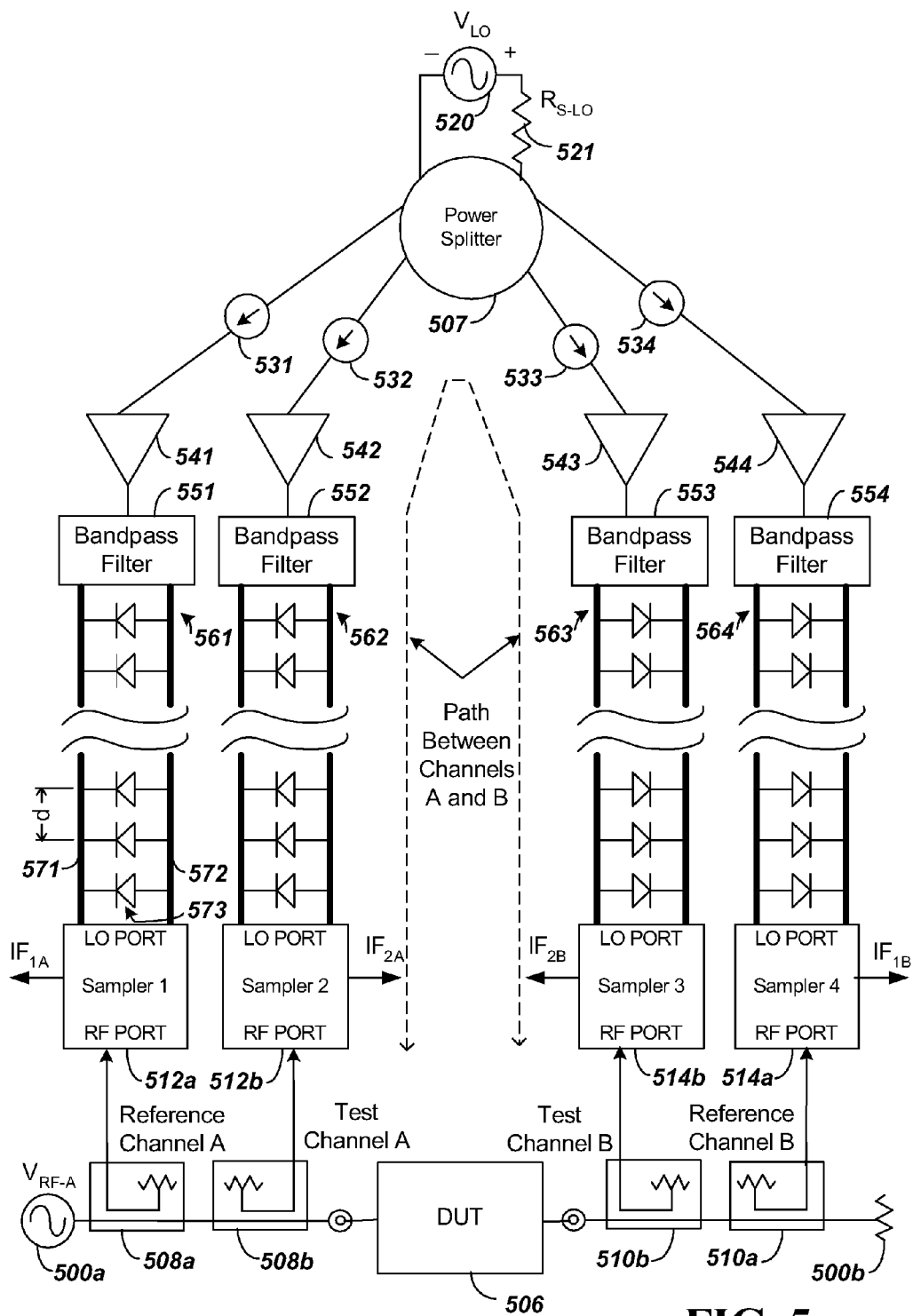
FIG. 5 shows a sampler-based VNA using shocklines (NLTLs) to provide the LO input to samplers.

With FIGS. 5 and 6 in mind, embodiments of the present invention are provided that control a tradeoff between noise and bandwidth using scaling of the LO drive frequency and the gating time Tg of NLTL-based samplers. Thus unlike an SRD-driven sampler, an NLTL-based sampler can be adjusted for optimal noise and bandwidth performance.

Scaling is thus used according to embodiments of the present invention to adjust noise performance vs. frequency by applying the following methods: (1) increasing or decreasing the Bragg cutoff frequency of the shockline, such as by changing the spacing d between varactor diodes of the NLTL, so as to either reduce or increase the gating time, Tg, of the NLTL-driven sampler; (2) changing the structure of the pulse forming network connected with the sampler, such as by changing the length of the voltage-step differentiator arms in the pulse forming network; and (3) changing the LO signal applied to the shockline. These three methods used together can accomplish scaling while optimizing the tradeoff between conversion loss and RF bandwidth.

Methods 1, 2 and 3 go hand in hand and are used together in order to extend the RF bandwidth of a VNA and optimize its noise performance. Method 1 scales the NLTL in order to reduce its fall time and thus extend its output for operation at high frequencies. Method 2 takes the output of that scaled NLTL and turns it into a pulse that is used to gate the Schottky switch/sampler over the appropriate frequency range. Method 3 picks the LO frequency range that results in optimal RF bandwidth and noise performance when using the scaling of method 1 and sampler gating in method 2.

Specifics to accomplish methods 1, 2 and 3 are detailed to follow. First, in method 1, the NLTLs of FIG. 5 are replaced with multiple NLTLs each having different frequency characteristics that are multiplexed to allow selection of one of the NLTLs to achieve overall broadband performance. To adjust the frequency characteristics between NLTLs, the spacing d between varactors is reduced gradually as one travels from the input of an NLTL to its output. This results in efficient NLTL fall-time compression, or equivalently, more efficient pulse generation. By using this non-uniform spacing between varactors, it is best practice not to generally refer to a single Bragg cutoff frequency for the NLTL. The scenario, instead, changes to two Bragg cutoff frequencies: one for the input of the NLTL and the other for its output. However, for the sake of convenience, a single Bragg cutoff frequency is still referenced herein.

For methods 2 and 3, simple modifications can be made to the VNA reflectometer circuitry to enable scaling. For method 2, referring to FIG. 2, the length of the stubs (210, 212), and (214, 218) can be physically changed in the sampler. For method 3, the $V_{LO}$ signal source 520 shown in FIG. 5 can have a frequency set, or alternatively a crystal or other fixed frequency reference can be provided with a desired operation frequency to optimize the overall performance in methods 1 and 2.

Figure 8:
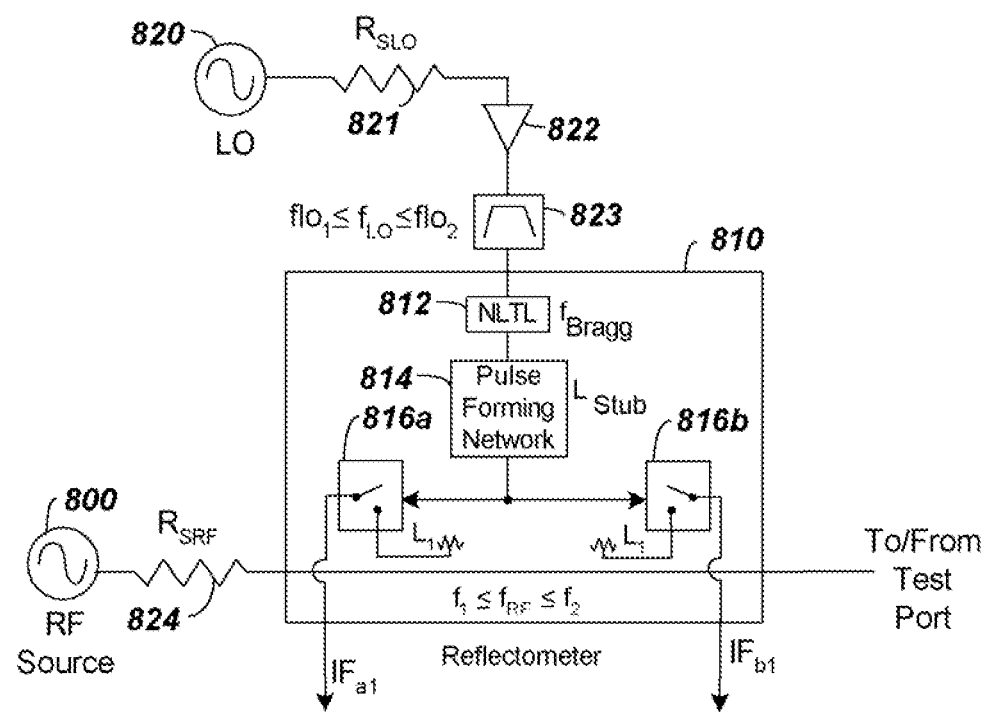
FIG. 8 shows one NLTL sampling circuit segment that can be multiplexed with other segments to form a shockline-based sampling reflectometer that operates over a wide bandwidth with a desired frequency vs. noise response.

FIG. 8 shows one NLTL sampling circuit segment 810 that can be multiplexed with other segments to form a shockline-based sampling reflectometer. The multiplexed circuit segment of FIG. 8 allows use of methods (1)-(3) to optimize for different LO and RF frequency ranges in each segment. The circuit segment 810 of FIG. 8 is intended to replace shocklines and associated circuitry in one channel for example, such as shocklines 561-562, samplers 512*a*, 512*b* and couplers 808*a*, 808*b* of FIG. 5.

Figure 1:
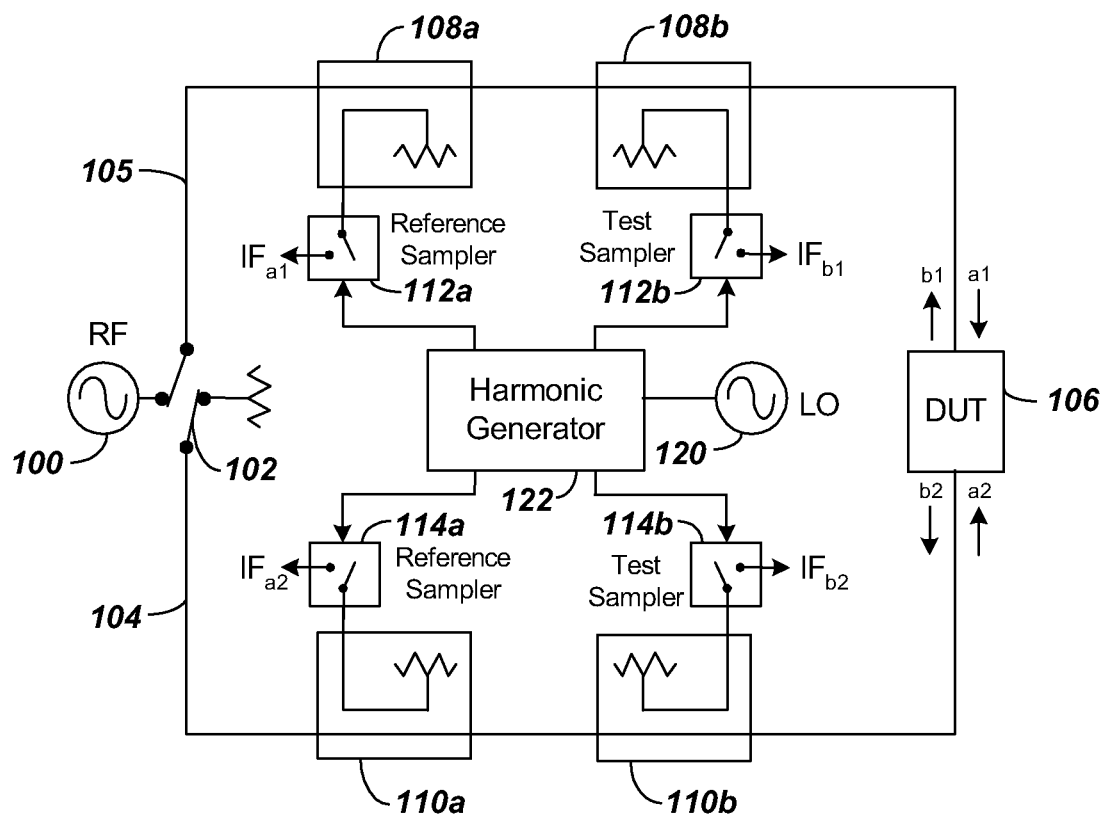
FIG. 1 is a block diagram illustrating typical components of a sampler-based VNA.
Figure 2:
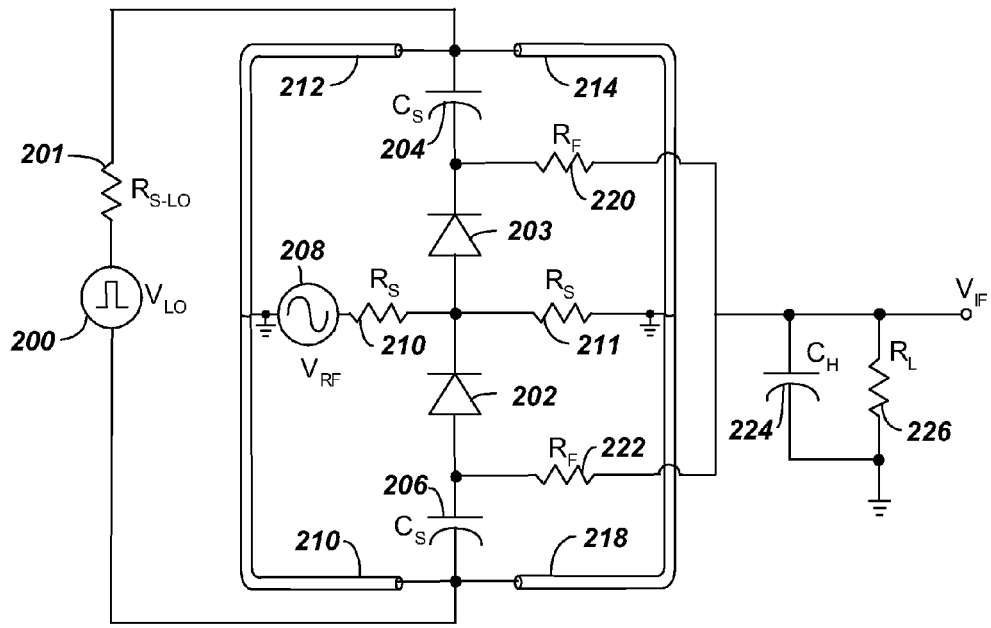
FIG. 2 shows one implementation of a sampling circuit that can be used in FIG. 1.
Figure 3:
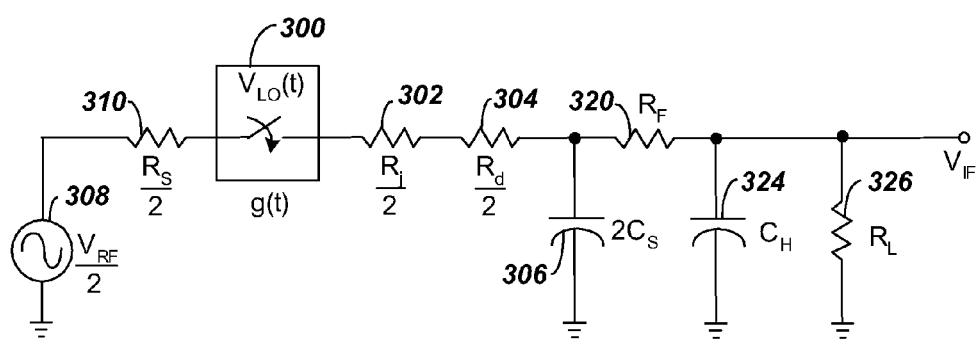
FIG. 3 shows an equivalent circuit for the components of FIG. 2.
Figure 4:
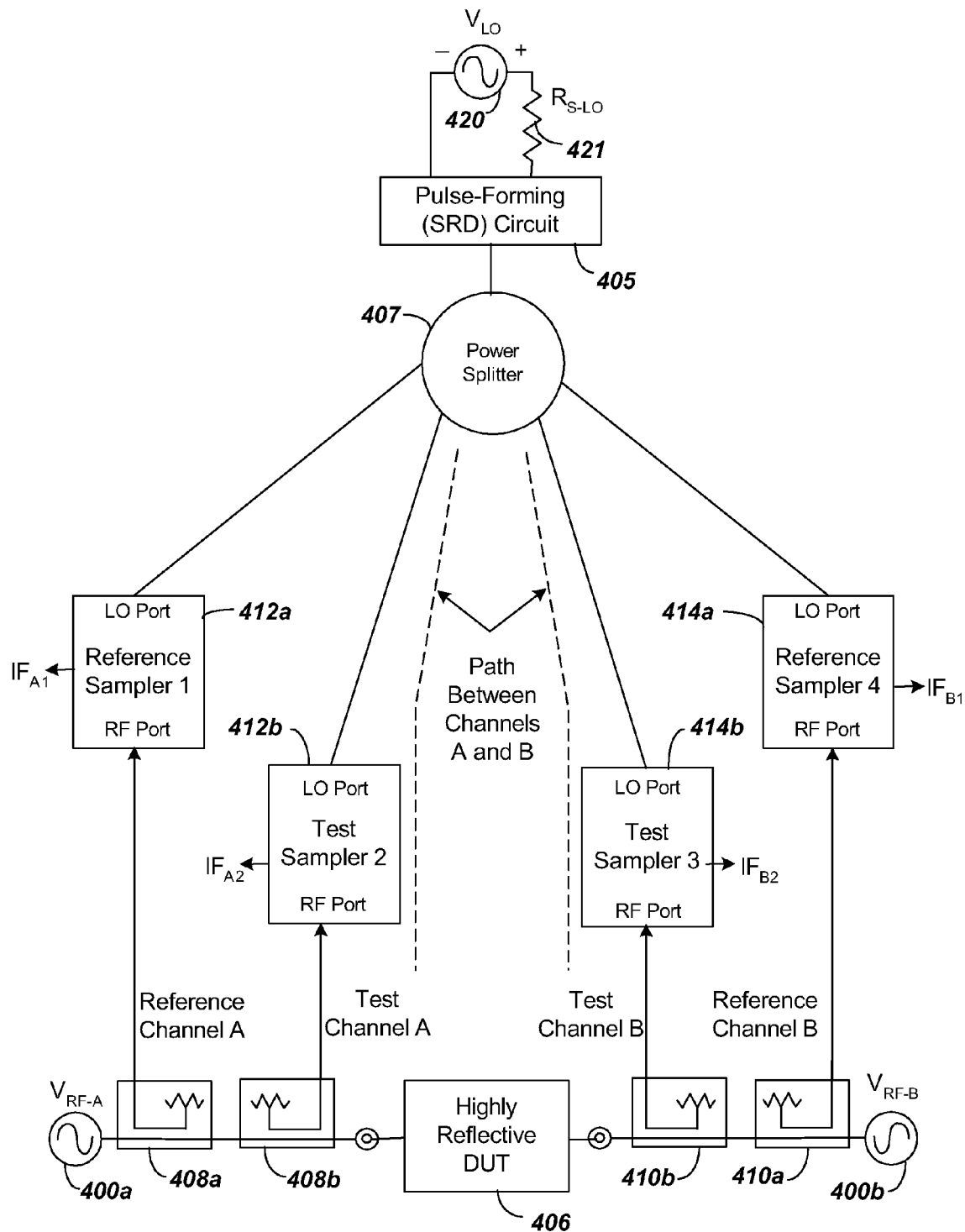
FIG. 4 illustrates a sampler-based VNA configuration that uses a single step recovery diode (SRD) circuit to drive the four separate samplers in a two channel VNA.

The components of the reflectometer segment 810 of FIG. 8 include a series connected shockline, or NLTL, 812 and pulse-forming network 814. The NLTL 812 receives an input from LO source 820 through bandpass filter 823. The pulse forming network 814, and samplers, 816*a* and 816*b* can have circuitry as shown in FIG. 2. The output of the pulse-forming network 814 is connected by a splitter to a first input of samplers 816*a* and 816*b*. The second input of sampler 816*a* is connected by a coupler to receive a signal from the RF source 800, while a coupler also provides a test signal from a test port to sampler 816*b*. The outputs of the samplers 816*a* and 816*b* then provide respective IF signals $IF_{a1}$ and $IF_{b1}$.

In FIG. 8, the reflectometer section 810 can have components selected to optimize performance for a given bandwidth. For example, the dimension d between the varactor diodes of the shockline in each reflectometer section can be different, the size of the differentiator arms can be different in the samplers, or a combination of these features could be changed between the reflectometers to accomplish a selective scaling. Varying components of the reflectometers 810 to change the Bragg frequency $f_{Bragg}$ enables the operation bandwidth $f_{RF}$ to change as shown in the drawings from $f1<f_{RF}<f2$. The length $L_{Stub}$ of pulse forming network 814 can likewise be varied to accomplish scaling, as described above. The couplers of the reflectometer section 880 have a variable length, shown as $L_1$, to match the RF bandwidth of the samplers. Common components that feed the reflectometer section 810 in FIG. 8 will also be used to feed other multiplexed reflectometer sections described in subsequent FIGS. 9 and 10. These common components include the LO source 820 that can be provided with a varying frequency range to reflectometers to accomplish a desired scaling. The LO source 820 is connected through a resistance $R_{SLO}$ 821, amplifier 822 and bandpass filter 823 to the input of the NLTL in the reflectometer section 810. The bandpass filter 823 can be adjusted to the LO frequency provided to the individual reflectometer section, and is shown having the frequency range $f_{LO}$ between $f_{LO1}$ and $f_{LO2}$. As indicated above the LO frequency can be adjusted to optimize performance for a given bandwidth. The RF source 800 is another common element that is connected through a resistance 824 to the reflectometer section 880.

The primary factors that limit the bandwidth of the single reflectometer of FIG. 8 are as follows. First, the couplers connecting the RF to samplers 816a and 816b have operation restricted to the frequency range $f_1 < f_{RF} < f_2$. Second the pulse forming network 814 has a restricted bandwidth of operation in the range of $f_{LO1} < f_{LO} < f_{LO2}$ which can require high harmonic numbers be use for down conversion in samplers 816a and 816b resulting in reduced performance. Further the bandwidth of the LO has a limited range. Multiplexing as provided in FIGS. 9 and 10 help resolve these limiting factors.

Figure 9:
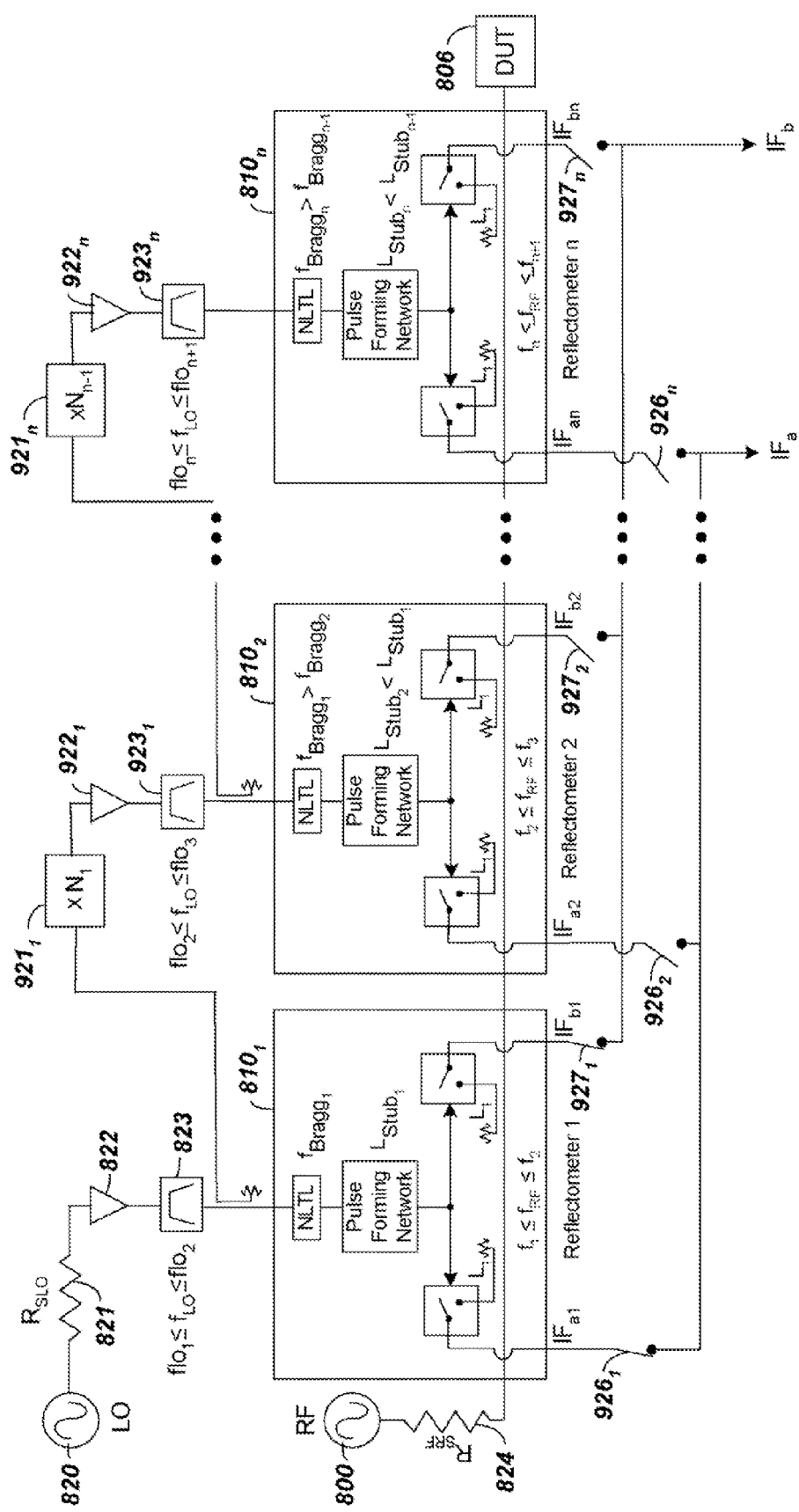
FIG. 9 shows one embodiment of circuitry for multiplexing reflectometer segments as shown in FIG. 8 to form a broadband reflectometer using a coupler-based LO distribution network.

FIG. 9 shows one embodiment of circuitry for multiplexing the reflectometer segments of FIG. 8 to form a broadband reflectometer with sections having a desired frequency vs. noise response. The reflectometer segments include segments $810_{1-n}$ that include components similar to those of reflectometer 810 in FIG. 8, so those components are not individually labeled. The internal components of the segments $800_{1-n}$ include components adjusted so they operate over different successive frequency ranges. For instance reflectometer segment $810_1$ has components set so that the RF frequency range $F_{RF}$ is $f_1 \leq F_{RF} \leq f_2$. The next reflectometer segment $810_2$ has an $F_{RF}$ occupying the next frequency range $f_2 \leq F_{RF} \leq f_3$, and so forth till the final segment $810_n$ that occupies the RF the frequency range $f_{n-1} \leq F_{RF} \leq f_n$.

To accomplish the different $F_{RF}$ bands, the Bragg cutoff frequencies of the NLTLs are varied, as are the stub lengths of the pulse forming network and the length of the couplers. In reflectometer segment $810_1$ the NLTL has a Bragg frequency $f_{Bragg}$ set to sequentially lower values, with $f_{Bragg1}$ of segment $810_1$ being less than $f_{Bragg2}$ of segment $810_2$ and so forth till $f_{Braggn}$ which is less than $fBraggn_{-1}$ in segment $810_n$. The Bragg cutoff frequency is varied by changing the distance d between varactor diodes of the NLTL as discussed with respect to FIG. 5, and can be controlled by setting the desired gating time Tg as discussed with respect to FIG. 7. The length of stubs in the pulse forming network also are changed to control bandwidth. The stubs of a first size $L_{Stub1}$ are provided in segment $810_1$, a slightly greater size $L_{Stub2}$ is provided in segment $810_2$ and larger sizes continue until the largest stub $L_{Stubn}$ is provided in segment $810_n$. Adjusting the stub size in the pulse-forming network to change the operation bandwidth is described previously with respect to FIG. 2. Further the lengths of the couplers are changed to sequentially greater frequency ranges and have a size beginning at $L_1$ in segment $810_1$ that increases to $L_n$ in segment $810_n$ to provide the overall desired bandwidth.

To provide an LO distribution system, an increasingly higher frequency LO signal range is provided to each sequential reflectometer segment $810_{1-n}$. For the first segment $880_1$, the LO source 820 in FIG. 9 is provided through a resistance $R_{SLO}$ 821, amplifier 822 and bandpass filter 823 to the input of the NTLT in the reflectometer section $810_1$ similar to the segment 810 of FIG. 8. For the next segment $880_2$, the output of bandpass filter 823 is provided by a coupler to frequency multiplier $921_1$ through amplifier $922_1$ and bandpass filter $923_1$ to the input of its NLTL. The frequency multiplier $921_1$ has a multiplier value $N_1$ set to provide a slightly increased $f_{LO}$ from $f1 \leq f_{LO} \leq f2$ in segment $810_1$ to $f2 \leq f_{LO} \leq f3$ for segment $810_2$. A similar coupler connects the LO in subsequent segments after $810_2$. For instance, the output of bandpass filter $923_1$ is provided to a subsequent frequency multiplier, and the coupling circuitry arrangement continues up to multiplier $921_n$ with value $N_{n-1}$. The output of multiplier $921_n$ then supplies amplifier $922_n$ and bandpass filter $923_n$ to create an $f_{LO}$ of $f_n \leq f_{LO} \leq f_{n-1}$ that is input to segment $810_n$.

The multiplexing circuitry of FIG. 9 also includes an IF distribution system with a series of switches $926_{1-n}$ and $927_{1-n}$ that individually connect the IF outputs of the segments $810_1$, to provide output IF signals IFa and IFb. The switch $926_1$ selectively connects the reference IF signal from segment $810_1$ to provide IFa, while switch $927_1$ selectively connects the test signal from segment $810_1$ to provide IFb. Similarly, switches $926_2$ and $927_2$ connect the IF outputs of segment $810_2$, and switch circuitry continues up to $926_n$ and $927_n$ that selectively provide IF signals from the output of segment $810_n$. A controller (not shown) connects the desired pair of switches in $926_{1-n}$ and $927_{1-n}$ to connect a desired one of reflectometer segments $810_{1-n}$ to provide the IFa and IFb outputs.

Figure 10:
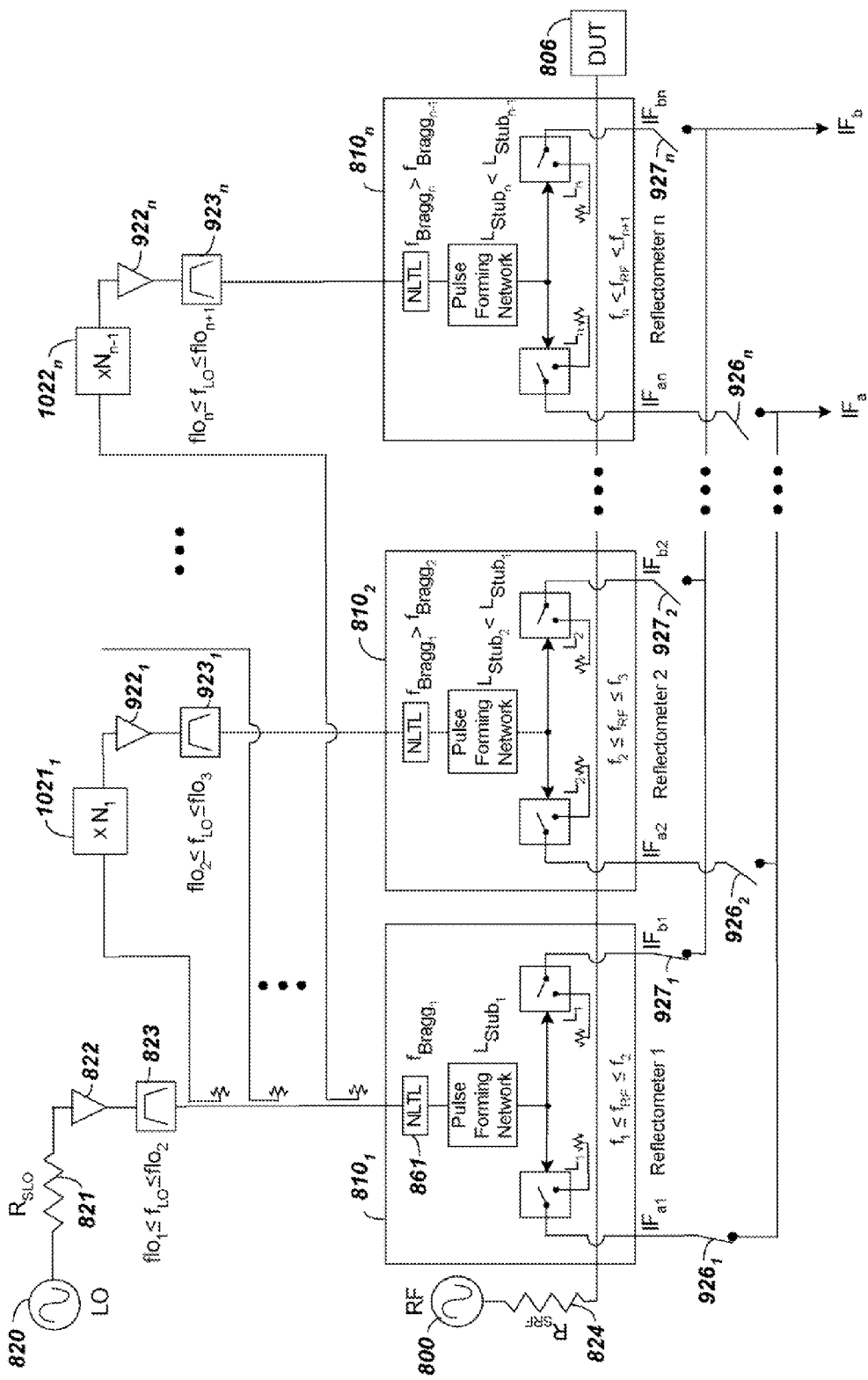
FIG. 10 shows an alternative reflectometer configuration to FIG. 9 that includes an LO distribution network with different LO coupler connections.

FIG. 10 shows an alternative reflectometer configuration to FIG. 9 that includes an LO distribution circuitry with different coupling connections. The LO distribution circuitry in FIG. 10 is changed from FIG. 9 to include frequency multipliers $1021_{1-n}$ that all connect by couplers between the output of bandpass filter 823 and the input of the first reflectometer segment 824. This configuration prevents the frequency multiplier values $N_1$ through $N_{n-1}$ from adversely affecting one another, as do the multipliers $921_{1-n}$ in FIG. 9 that are interconnected.

Figure 11:
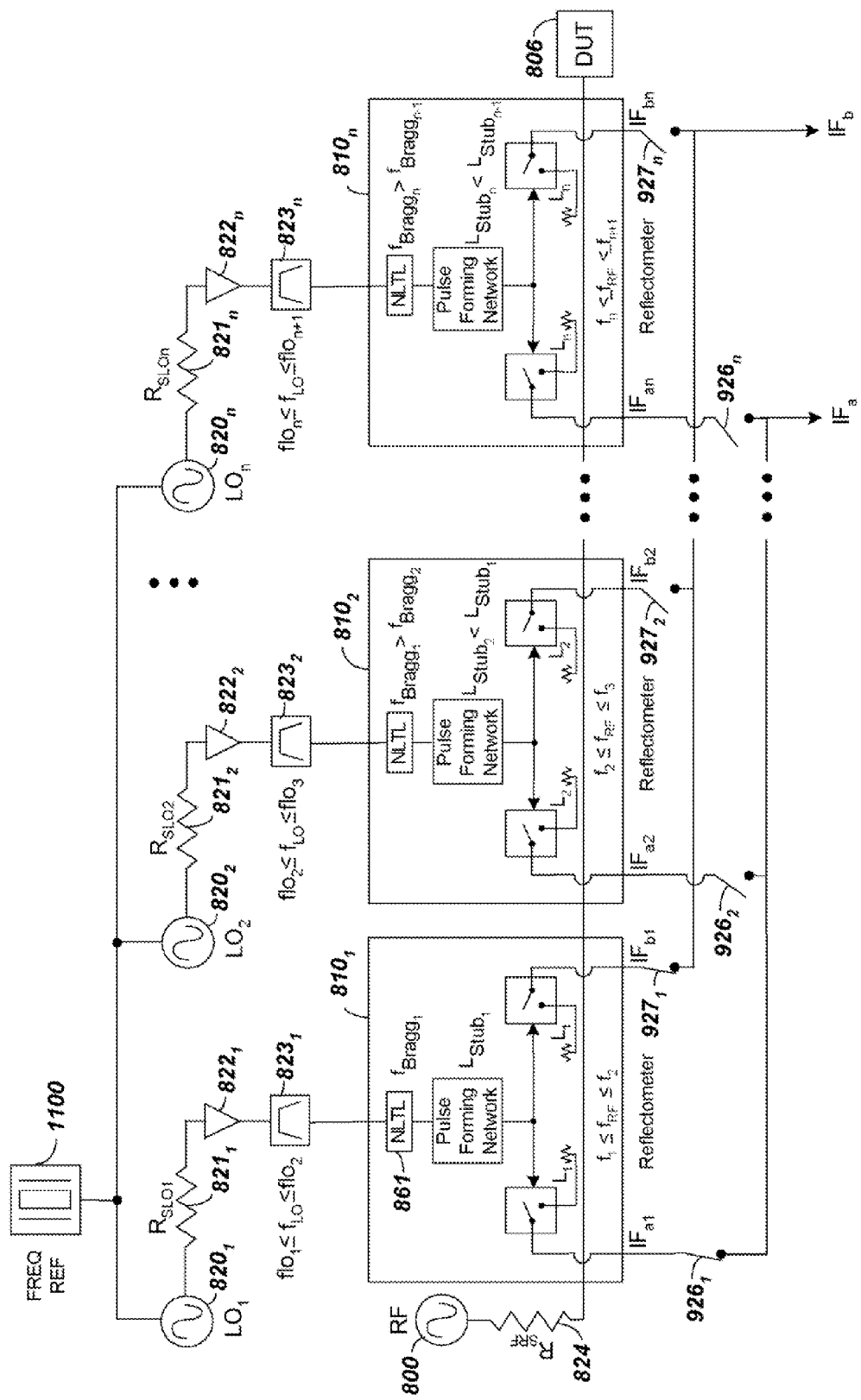
FIG. 11 shows another alternative reflectometer configuration to FIG. 9 that includes an LO distribution network without using couplers.

FIG. 11 shows another alternative reflectometer configuration to FIG. 9 that includes an LO distribution circuitry without using couplers. Instead of using couplers, the circuitry of FIG. 11 includes a reference crystal oscillator or other reference frequency source 1100 that is connected to separate LO sources $820_{1-n}$ that feed the reflectometer segments $810_{1-n}$. The separate LO sources $820_{1-n}$, labeled $LO_{1-n}$, each operate over a different frequency range and are synchronized by the crystal reference (or other reference frequency source) 1100. The local oscillators $820_{1-n}$ connect through amplifiers $822_{1-n}$ and bandpass filters $823_{1-n}$ to the NLTLs in respective segments $810_{1-n}$. The bandpass filters $823_{1-n}$ are configured to operate over the successive frequency ranges of the LO sources $820_{1-n}$, such as $f_1 \leq f_{LO} \leq f_2$ in bandpass filter $823_1$, $f_2 \leq f_{LO} \leq f_3$ in bandpass filter $823_2$ and $f_n \leq f_{LO} \leq f_{n-1}$ in bandpass filter $823_n$.

Figure 12:
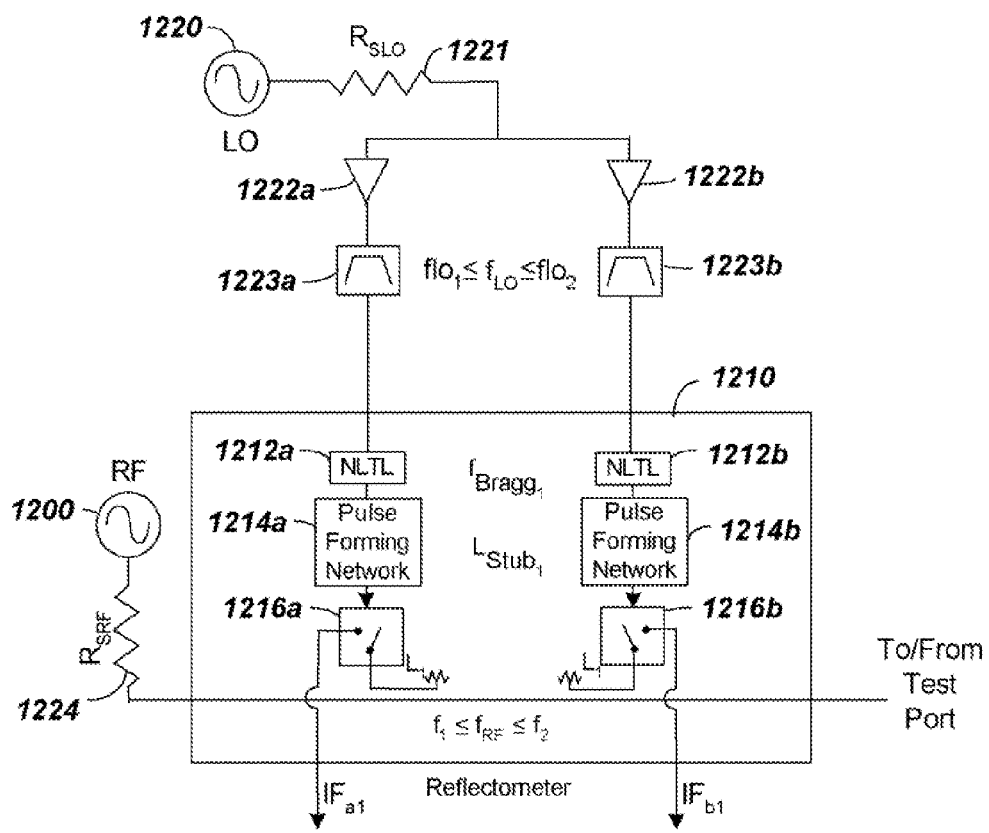
FIG. 12 shows an NLTL sampling circuit segment alternative to FIG. 8 that can be multiplexed with other segments to form a shockline-based sampling reflectometer.

FIG. 12 shows an NLTL sampling circuit segment 1210 providing alternative to segment 810 of FIG. 8 that can be multiplexed with other segments to form a broadband shockline-based sampling reflectometer. The reflectometer circuit segment FIG. 12 differs from FIG. 8 by including separate NLTLs 1212a and 1212b in the test and reference channels as opposed to a single NLTL 812 in FIG. 8. Similarly, instead of a single pulse forming network 814 in FIG. 8, the circuit of FIG. 12 includes two separate pulse forming networks 1212a and 1214b connecting the output of the two NLTLs 1212a and 1212b to respective couplers 1216a and 1216b. The NLTLs 1212a and 1212b and pulse forming networks 1214a and 1214b allow better isolation between the test and reference channels and can be used when a very low noise floor is desired.

With separation of the NLTLs 1212a and 1212b, to achieve greater isolation, the signal from LO source 1220 that is provided through resistor 1221 is separated in a splitter between amplifiers 1222a and 1222b. The output of amplifier 1222a is provided through bandpass filter 1223a to the input of NLTL 1212a. The output of amplifier 1222b is provided through bandpass filter 1223b to the input of NLTL 1223b. The frequency range $f_{LO}$ of bandpass filters 1223a and 1223b is the same at $f_1 \leq f_{LO} \leq f_2$. As in FIG. 8, a single RF source 1200 and resistor 1224 supply the RF signal through couplers of the reflectometer section 1210.

Also with the circuitry of FIG. 12, the couplers 1216a and 1216b can be integrated with the individual NLTLs. Like the couplers 1216a and 1216b, the shockline-based sampler can be monolithic, enabling the directional couplers 1216a and 1216b to be integrated onto the same substrate as the respective shocklines 1212a and 1212b. This can improve stability (as in mechanical stability) and raw directivity (precision formation of the coupling structure). Both of these improvements can help increase electrical measurement stability.

Figure 13:
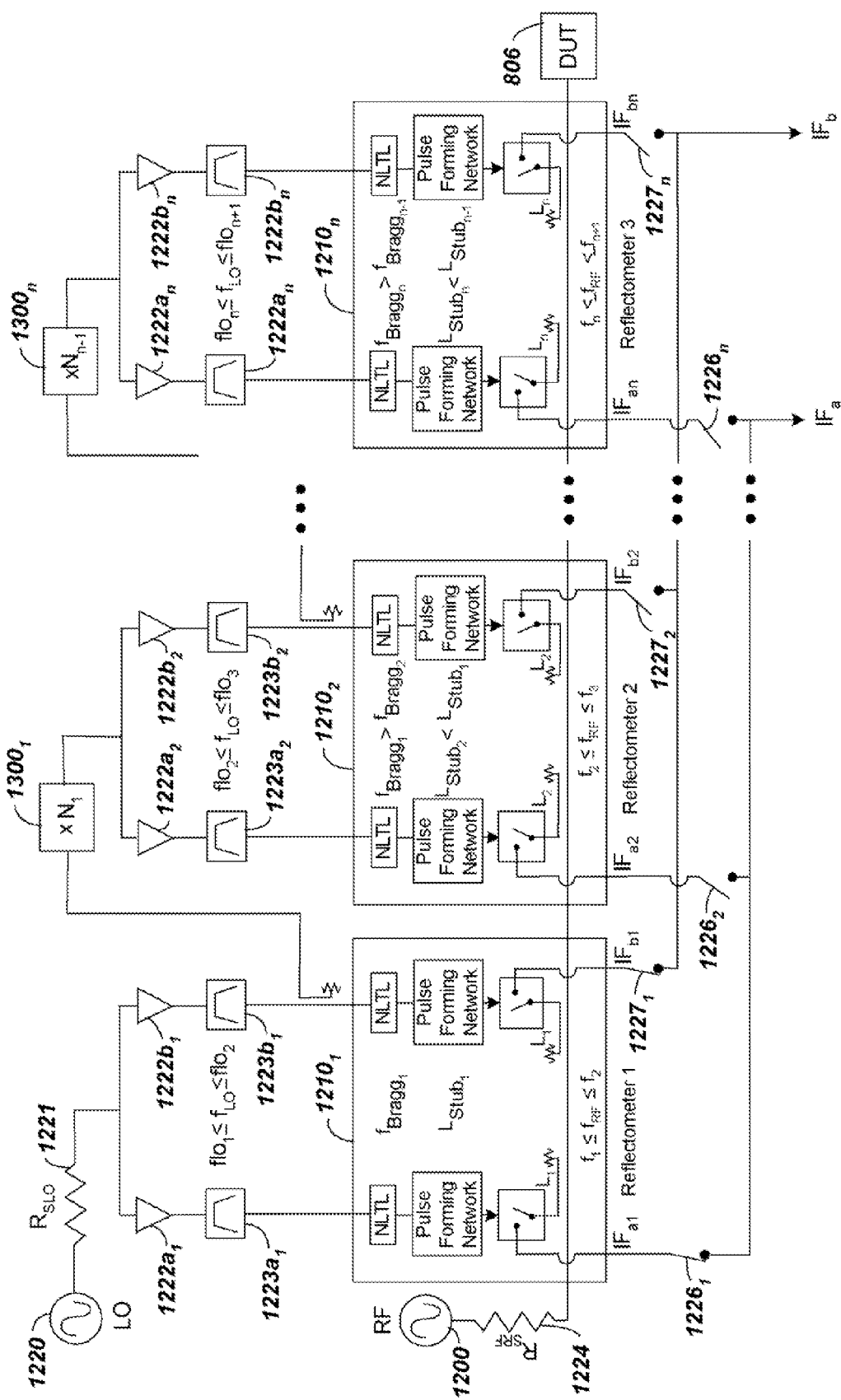
FIG. 13 shows one embodiment of circuitry for multiplexing reflectometer segments as shown in FIG. 12 to form a reflectometer using a coupler-based LO distribution network.

FIG. 13 shows one embodiment of circuitry for multiplexing reflectometer segments as shown in FIG. 12 to form a reflectometer. The reflectometer segments include segments 1210$_{1-n}$ that include components similar to those of reflectometer 1210 in FIG. 12, so those components are not individually labeled. The configuration of circuitry in FIG. 13 includes frequency multipliers 1300$_{1-n}$ connected by couplers to the NLTL of the first segment 1210$_1$, similar to interconnection circuitry of FIG. 9.

In FIG. 13, similar to the arrangement of FIG. 9, the internal components of the segments 1200$_{1-n}$ include components adjusted so they operate over different successive frequency ranges. For instance reflectometer segment 1210$_1$ has components set so that the RF frequency range $F_{RF}$ is $f_1 \leq F_{RF} \leq f_2$. The next reflectometer segment 1210$_2$ has an $F_{RF}$ occupying the next frequency range $f_2 \leq F_{RF} \leq f_3$, and so forth till the final segment 1210$_n$ that occupies the RF the frequency range $f_{n-1} \leq F_{RF} \leq f_n$. The IF distribution system includes a series of switches 1226$_{1-n}$ and 1227$_{1-n}$ that individually connect the IF outputs of the segments 1210$_{1-n}$ to provide output IF signals IFa and IFb.

To provide an LO distribution system in FIG. 13, a sequentially higher frequency LO signal range is provided to each sequential reflectometer segment 1210$_{1-n}$. For the first segment 1210$_1$, the LO source 1220 from FIG. 12 is provided through a resistance $R_{SLO}$ 1221, amplifiers 1222$_{a1}$ and 1221$_{b1}$ and bandpass filters 1223$_{a1}$ and 1223$_{b1}$ to the input of the NTLTs in the reflectometer section 1210$_1$ similar to the segment of FIG. 12. For the next segment 1210$_2$, the output of bandpass filter 1223$_{b1}$ is provided by a coupler to frequency multiplier 1300$_1$ through amplifiers 1222$_{a2}$ and 1222$_{b2}$ and bandpass filters 1223$_{a2}$ and 1223$_{b2}$ to the input of its NLTL 1210$_2$. The frequency multiplier 1300$_1$ has a multiplier value $N_1$ set to provide a slightly increased $f_{LO}$ from $f_1 \leq f_{LO} \leq f_2$ in segment 1210$_1$ to $f_2 \leq f_{LO} \leq f_3$ for segment 1210$_2$. A similar coupler connects the LO from bandpass filter 1223$_{b2}$ to a subsequent segment. The circuitry continues up to multiplier 1300$_n$ with value $N_{n-1}$. The output of multiplier 1300$_n$ supplies amplifiers 1222$_{an}$ and 1222$_{bn}$ and bandpass filters 1223$_{bn}$ and 1223$_{bn}$ to create an $f_{LO}$ of $f_n \leq f_{LO} \leq f_{n-1}$ that is input to segment 1210$_n$.

Figure 14:
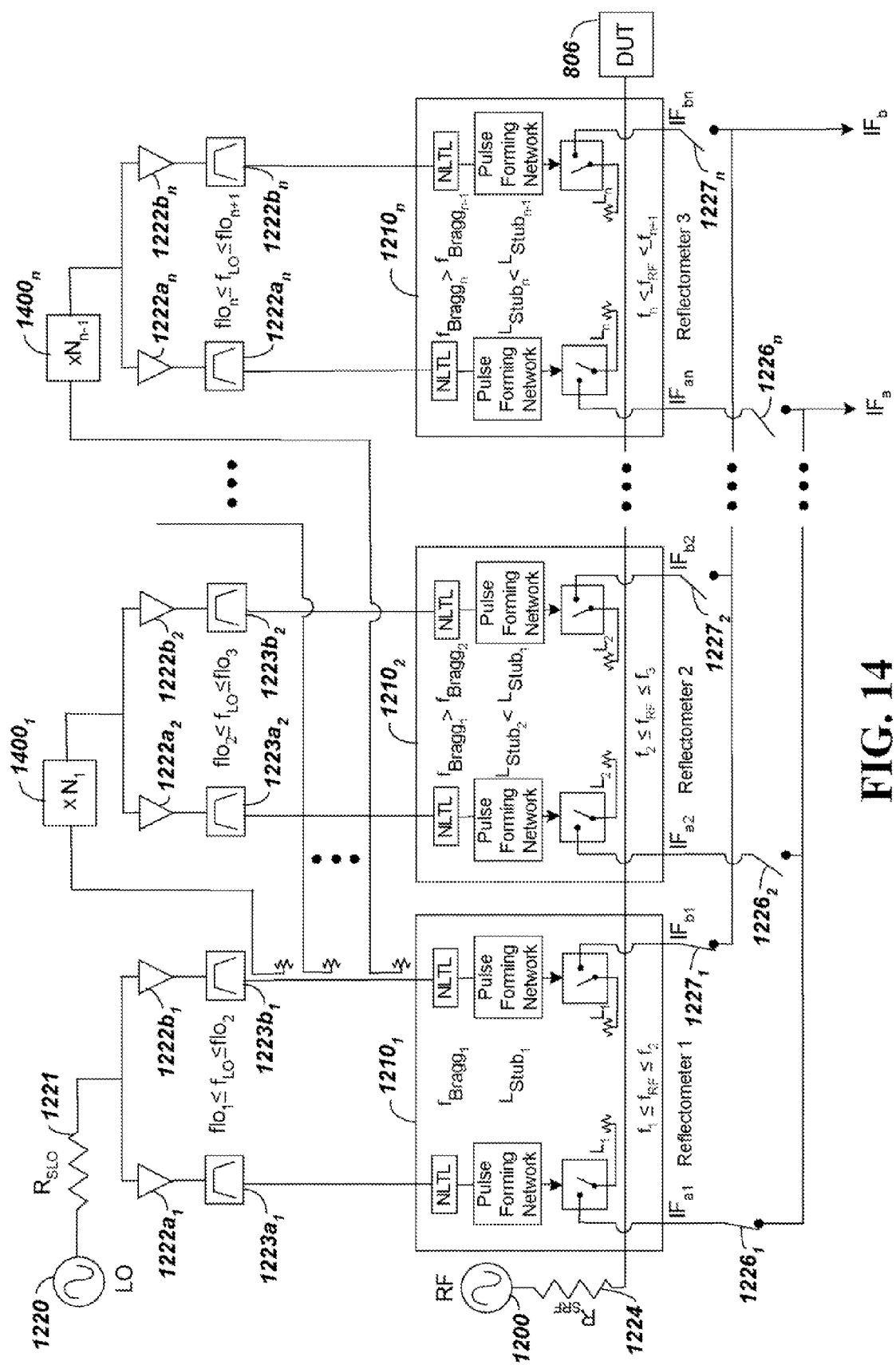
FIG. 14 shows an alternative reflectometer configuration to FIG. 13 that includes an LO distribution network with different LO coupler connections.

FIG. 14 shows an alternative reflectometer configuration to FIG. 13 that includes an LO distribution circuitry with different LO coupler connections. Similar to FIG. 10, the LO distribution in FIG. 13 is changed to include frequency multipliers 1400$_{1-n}$ that all connect by couplers between the output of bandpass filter 1223$_{b1}$ and the input of the first reflectometer segment 1210$_1$. This configuration prevents the frequency multiplier values $N_1$ through $N_{n-1}$ in multipliers 1400$_{1-n}$ from adversely affecting one another, as they do the multipliers 1300$_{1-n}$ in FIG. 13 that are interconnected.

Figure 15:
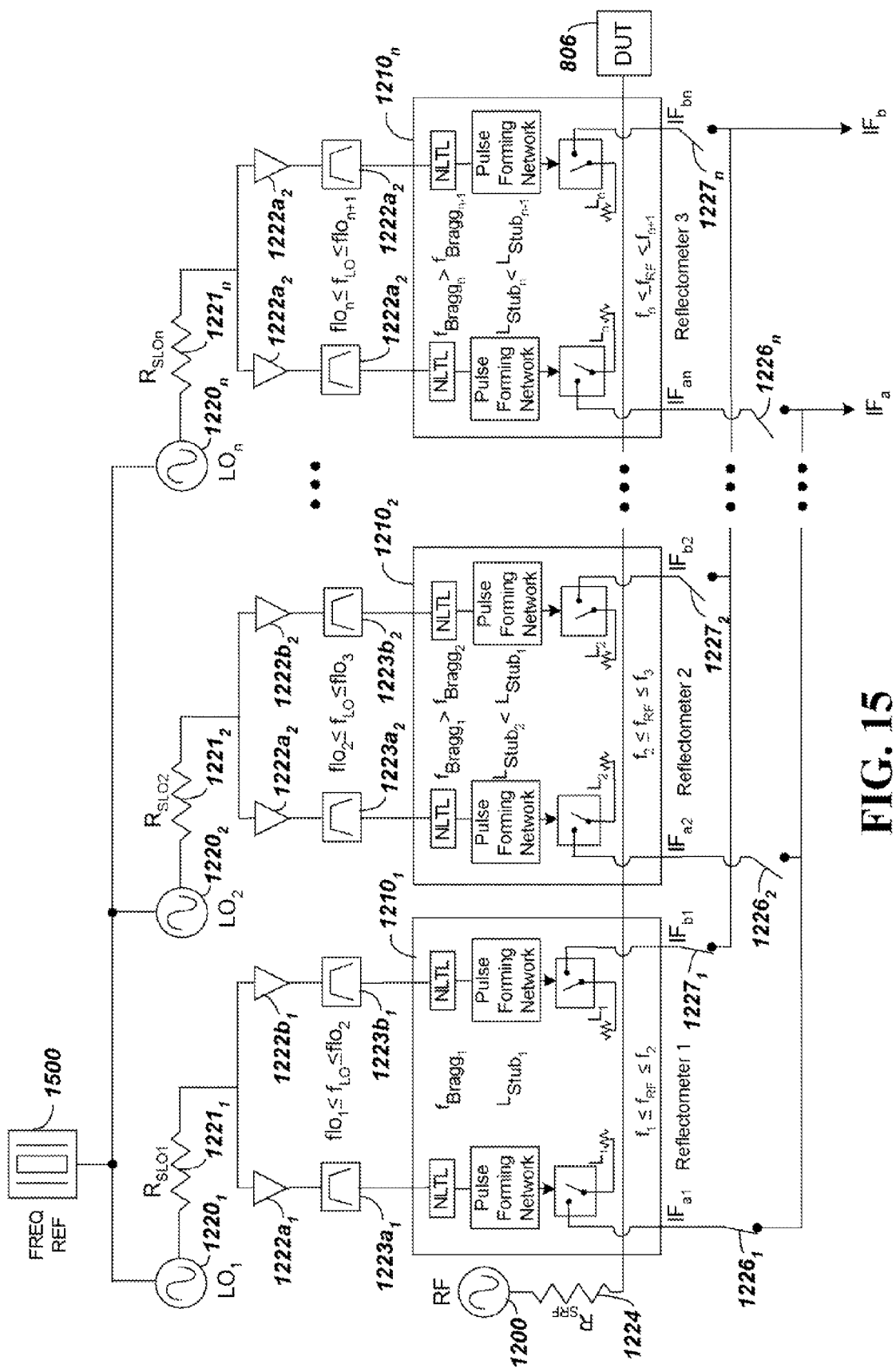
FIG. 15 shows another alternative reflectometer configuration to FIG. 13 that includes an LO distribution network without using couplers.

FIG. 15 shows another alternative reflectometer configuration to that of FIGS. 13 and 14 that includes an LO distribution circuitry without using couplers. Instead of using couplers, the circuitry of FIG. 15 includes a reference crystal oscillator (or other reference frequency source) 1500 that is connected to separate LO sources 1220$_{1-n}$ that feed the reflectometer segments 1210$_{1-n}$. The separate LO sources 1220$_{1-n}$, labeled $LO_{1-n}$, each operate over a different frequency range and are synchronized by the crystal reference (or other reference frequency source) 1500. The local oscillators 1220$_{1-n}$ connect through amplifiers 1222$a_{1-n}$ and 1222$b_{1-n}$ and bandpass filters 1223$_{1-n}$ and 1223$b_{1-n}$ to the NLTLs in respective segments 1210$_{1-n}$. The bandpass filters 1223$_{1-n}$ are configured to operate over successive frequency ranges of the LO sources 1220$_{1-n}$, such as $f_1 \leq f_{LO} \leq f_2$ in bandpass filter 1223$_1$, $f_2 \leq f_{LO} \leq f_3$ in bandpass filter 1223$_2$ and $f_n \leq f_{LO} \leq f_{n-1}$ in bandpass filter 1223$_n$.

Although the present invention has been described above with particularity, this was merely to teach one of ordinary skill in the art how to make and use the invention. Many additional modifications will fall within the scope of the invention, as that scope is defined by the following claims.

What is claimed:

1. A shockline-based receiver down-converter comprising:
a plurality of reflectometer segments each including
  a shockline,
  a sampler having a local oscillator (LO) input,
  radio frequency (RF) inputs coupled to receive an RF reference signal and an RF test signal, and
  intermediate frequency (IF) reference and test outputs to provide down-converted signals for digital processing; and
a LO distribution system having an input connected to receive at least one LO signal, the LO distribution system for distributing the LO signal through the plurality of reflectometer segments to the LO inputs of the samplers,
wherein a Bragg cutoff frequency of the shockline varies between the plurality of reflectometer segments;
wherein a frequency range of the LO signal is selectable and the LO signal is selectably connectable with one of the reflectometer segments based on both a resultant noise performance and a resultant RF bandwidth of the sampler.

2. The shockline-based receiver down-converter of claim 1, wherein for each of the plurality of reflectometer segments, the shockline components include transmission lines with diodes connected in-between, wherein the spacing between the diodes is varied to scale the frequency range of the receiver.

3. The shock-line based receiver of claim 1, wherein for each of the plurality of reflectometer segments, the samplers are altered relative to one another to scale the frequency range of the receiver.

4. The shockline-based receiver down-converter of claim 1, further comprising:
at least one LO signal generator providing the at least one LO signal, wherein the frequency of the at least one LO signal is varied to scale the frequency range of the receiver.

5. The shockline-based receiver down-converter of claim 1, wherein each sampler comprises:

series connected diodes, with the RF input connection for the sampler formed at the inter-connection of a first end of the diodes;

capacitors, each capacitor having a first end connected to as second end of one of the diodes and a second end connected to form the LO input of the sampler, wherein the first end of each capacitor is further connected to form the IF output of the sampler;

shorted transmission line stubs, each transmission line stub having a first end connected to the second end of the diode and a second end connected to ground, wherein a length of the shorted transmission line stubs is varied to scale the frequency range of the receiver.

6. The shockline-based receiver down-converter of claim 1, wherein one of the shocklines and samplers form shockline assemblies each comprising:

a shockline comprising transmission lines with diodes connected in-between with a given spacing;

a first sampler having an LO input connected to the shockline, an RF input connected to the RF test signal input, and having an IF test signal output; and a second sampler having an LO input connected to the shockline, an RF input connected to the RF reference signal input, and having an RF test signal output, wherein the shockline-based receiver further comprises:

a multiplexer switch assembly including switches to selectively connect individual ones of multiple shockline assemblies, each shockline assembly having a different given spacing between diodes between the LO distribution system and a digital processor, wherein selectively connecting the shockline assembly enables scaling the frequency range of the receiver.

7. The shockline-based receiver down-converter of claim 6 further consisting of:

a pair of directional couplers each connecting one of the RF test signal input and the RF reference signal input to a RF sampler node, wherein the multiplexer switch assembly further includes switches to selectively connect the RF sampler node of the pair of directional couplers to the RF test signal input of the first sampler and the RF reference signal input of the second sampler of a connected one of the sampler assemblies, and wherein the directional couplers are integrated with the shocklines of the shockline assemblies onto a single integrated circuit.

8. The shockline-based receiver down-converter of claim 1, wherein the shocklines and the samplers form shockline assemblies each comprising:

a first shockline comprising transmission lines with diodes connected in-between with a given spacing; a first sampler having an LO input connected to the first shockline, an RF input connected to the RF test signal input, and having an IF test signal output;

a second shockline comprising transmission lines with diodes connected in-between with the given spacing; and a second sampler having an LO input connected to the second shockline, an RF input connected to the RF reference signal input, and having an RF test signal output, wherein the shockline-based receiver further comprises:

a multiplexer switch assembly including switches to selectively connect individual ones of multiple shockline assemblies, each shockline assembly having a different given spacing between diodes of the first and second shocklines between the LO distribution system and a digital processor, wherein selectively connecting the shockline assembly enables scaling the frequency range of the receiver.

9. A shockline-based receiver down-converter, comprising:

shocklines;

samplers, each sampler having a local oscillator (LO) input, radio frequency (RF) inputs coupled to receive an RF reference signal and an RF test signal, and intermediate frequency (IF) reference and test outputs to provide down-converted signals for digital processing; and a LO distribution system having an input connected to receive at least one LO signal, the LO distribution system for distributing the LO signal through the shocklines to the LO inputs of the at least two samplers;

wherein components of at least one of the shocklines are altered relative to one another to scale the frequency range of the receiver;

wherein the shockline components include transmission lines with varactor diodes connected in-between, wherein the samplers include shorted transmission line stubs, and wherein the frequency of the at least one LO signal can be changed, wherein the spacings between the varactor diodes, the lengths of the shorted transmission line stubs, and the frequency of the least one LO signal are altered to scale the frequency range of the receiver.

10. A method of scaling a frequency range of a shockline-based receiver comprising:

providing a plurality of shocklines each composed of transmission lines with diodes connected in-between, wherein each of the shocklines has a different spacings between diodes than other ones of the shocklines; and selectively connecting a shockline from the plurality of shocklines between a local oscillator (LO) source of the receiver and at least one sampler;

distributing a LO signal from the LO source through the selectively connected shockline to the at least one sampler;

wherein a frequency range of the LO signal is selectable and the shockline is selectively connected based on both a resultant noise performance and a resultant radio frequency (RF) bandwidth of the at least one sampler.

11. The method of claim 10 further comprising varying the length of differential transmission line stubs provided in the samplers connected to each of the shocklines to further enable scaling the frequency range of the shockline based receiver.

12. The method of claim 11 further comprising selecting the frequency of the LO source to further enable scaling the frequency range of the shockline based receiver.

13. The method of claim 10 further comprising integrating couplers of the at least one sampler on a monolithic substrate with the plurality of shocklines.

14. The method of claim 10 further comprising forming the shocklines as a coplanar waveguide loaded with Schottky diodes and terminated with a load.

* * * * *